(12) United States Patent
Goushcha

(10) Patent No.: US 7,667,400 B1
(45) Date of Patent: Feb. 23, 2010

(54) BACK-ILLUMINATED SI PHOTOMULTIPLIERS: STRUCTURE AND FABRICATION METHODS

(75) Inventor: Alexander O. Goushcha, Aliso Viejo, CA (US)

(73) Assignee: Array Optronix, Inc., Costa Mesa, CA (US)

( * ) Notice: Subject to any disclaimer, the term of this patent is extended or adjusted under 35 U.S.C. 154(b) by 425 days.

(21) Appl. No.: 11/811,121

(22) Filed: Jun. 7, 2007

Related U.S. Application Data

(60) Provisional application No. 60/812,242, filed on Jun. 9, 2006.

(51) Int. Cl.
*H01J 43/04* (2006.01)
(52) U.S. Cl. .................... 313/532; 313/523
(58) Field of Classification Search ............ 313/532, 313/533, 534, 536, 523, 399, 535; 250/207; 315/11, 12.1
See application file for complete search history.

(56) References Cited

U.S. PATENT DOCUMENTS

| | | | | |
|---|---|---|---|---|
| 5,146,296 | A | * | 9/1992 | Huth .......................... 257/429 |
| 5,596,186 | A | * | 1/1997 | Kobayashi ............... 250/214.1 |
| 6,541,836 | B2 | * | 4/2003 | Iwanczyk et al. ........... 257/429 |
| 6,762,473 | B1 | | 7/2004 | Goushcha et al. |

OTHER PUBLICATIONS

A. G. Chynoweth et al., "Photon Emission from Avalanche Breakdown in Silicon", Physical Review, Apr. 15, 1956, pp. 369-376, vol. 102, No. 2.

A. G. Chynoweth et al., "Internal Field Emission in Silicon p-n Junctions", Physical Review, May 1, 1957, pp. 418-426, vol. 106, No. 3.

A. G. Chynoweth et al., "Light Emission and Noise Studies of Individual Microplasmas in Silicon p-n Junctions", Journal of Applied Physics, Nov. 1959, pp. 1811-1813, vol. 30, No. 11.

Jeff Bude et al., "Hot-carrier luminescence in Si", Physical Review B, Mar. 15, 1992, pp. 5848-5856, vol. 45, No. 11.

A. Lacaita et al., "Photon-assisted avalanche spreading in reach-through photodiodes", Applied Physics Letters, Feb. 8, 1993, pp. 606-608, vol. 62, No. 6.

(Continued)

*Primary Examiner*—Peter J Macchiarolo
*Assistant Examiner*—Glenn Zimmerman
(74) *Attorney, Agent, or Firm*—Blakely Sokoloff Taylor & Zafman LLP

(57) ABSTRACT

Back-illuminated silicon photomultipliers having a substrate of a first conductivity type having front and back sides, a matrix of regions of a second conductivity type in the substrate, a matrix of regions of the first conductivity type under the matrix of regions of the second conductivity type and adjacent the back side of the substrate, with the bottom of the matrix of regions of the second conductivity type forming a p/n junction with the substrate or a matrix of regions of the second conductivity type, the matrix of regions of the first conductivity type having a higher conductivity than the substrate, a common anode formed by a uniform layer of the first conductivity type of higher conductivity than the substrate on the back side of the substrate. Preferably a plurality of trenches filed with an opaque material are provided in the back side of the substrate, the substrate preferably having a thickness of less than approximately 150 um.

32 Claims, 4 Drawing Sheets

OTHER PUBLICATIONS

Andrea L. Lacaita et al., "On the Bremsstrahlung Origin of Hot-Carrier-Induced Photons in Silicon Devices", IEEE Transactions on Electron Devices, Mar. 1993, pp. 577-582, vol. 40, No. 3.

S. Villa et al., "Photon emission from hot electrons in silicon", Physical Review B, Oct. 15, 1995, pp. 10 993-10 999, vol. 52, No. 15.

V. Saveliev et al., "Silicon avalanche photodiodes on the base of metal-resistor-semiconductor (MRS) structures", Nuclear Instruments and Methods in Physical Research A, 2000, pp. 223-229, No. 442.

P. Buzhan et al., "An Advanced Study of Silicon Photomultiplier", ICFA Instrumentation Bulletin, 2001, 14 unnumbered pages.

P. Buzhan et al., "Silicon photomultiplier and its possible applications", Nuclear Instruments and Methods in Physics Research A, 2003, pp. 48-52, No. 504.

Valeri Saveliev, "The recent development and study of silicon photomultiplier", Nuclear Instruments and Methods in Physics Research A, 2004, pp. 528-532, No. 535.

V. Golovin et al., "Novel type of avalanche photodetector with Geiger mode operation", Nuclear Instruments and Methods in Physics Research A, 2004, pp. 560-564, No. 518.

V.D. Kovaltchouk et al., "Comparison of a silicon multiplier to a traditional vacuum photomultiplier", Nuclear Instruments and Methods in Physics Research A, 2005, pp. 408-415, No. 538.

A. N. Otte et al., "Status of Silicon Photomultiplier Developments as optical Sensors for MAGIC/EUSO-like Detectors", 29th International Cosmic Ray Conference Pune, 2005, pp. 1-4.

Deborah J. Herbert et al., "First Results of Scintillator Readout With Silicon Photomultiplier", IEEE Transactions on Nuclear Science, Feb. 2006, pp. 389-394, vol. 53, No. 1.

N. Otte et al., "The Potential of SiPM as Photon Detector in Astroparticle Physics Experiments liek MAGIC and EUSO", Nuclear Physics B Proceedings Supplements, 2006, pp. 144-149, No. 150.

* cited by examiner

BACK-ILLUMINATED SI PHOTOMULTIPLIERS: STRUCTURE AND FABRICATION METHODS

CROSS-REFERENCE TO RELATED APPLICATION

This application claims the benefit of U.S. Provisional Patent Application No. 60/812,242 filed Jun. 9, 2006.

BACKGROUND OF THE INVENTION

1. Field of the Invention

The present invention relates to the field of photomultipliers.

2. Prior Art

Growing demand on photo detectors capable of detecting small intensity light fluxes and counting of single photons facilitated designing novel solid state detectors. One of them is the so-called silicon photomultiplier (SiPM), which was claimed to be able to replace traditional photomultiplier tubes (PMT). Among the possible areas of application of such detectors are high energy physics and nuclear medicine, in which brief detection of a small number of optical photons produced by a single γ-quantum in a scintillator crystal is required. Due to the features of their structure, SiPM have advantages of low operating voltage (<50 V), fast response time (~100 ps), small size, etc. However, currently available designs have drawbacks that limit their application (see below).

A silicon photomultiplier (SiPM) is a device, which is in fact a large number of small SPAD (single photon avalanche diode) pixels, connected in parallel to a single output circuit. The detailed description of the conventional device is presented in several recent works which describe the front illuminated device. Its operation is based on the idea that very small SPAD pixels, if assembled in a dense, two-dimensional (2D) array, can be fired separately by a single photon each. Therefore, the overall signal output is proportional to the number of pixels fired at a time and the dynamic range of such 2D array of m elements is proportional to m.

One of the possible versions of a conventional front-illuminated structure is presented in FIG. 1. The structure of each pixel can be either a regular reach-through structure built on a p-type substrate (as it is shown in FIG. 1), or the other possible version that does not require reach-through effect. For example, the structure built on n-type substrate with a buried p+ layer can be applied. The operating voltage is several volts above the avalanche threshold, which drives each pixel in a Geiger operation mode.

The structure in FIG. 1 is built using a p-type substrate 1 with a thin epi layer 2. The Geiger mode avalanche pixels are represented by the cathode diffusion region 3 and avalanche region 4. The substrate 1 serves as the anode. The junction depth 1 is small enough to maximize quantum efficiency in the short wavelength range. The photo-generated carriers can be collected either from the avalanche region 4 solely, or from both the avalanche region 4 and depleted intrinsic layer w.

Two pixels of SiPM shown in FIG. 1 can be fired simultaneously by two different photons. To avoid optical crosstalk generated by hot carriers in avalanche region, the narrow trenches 10 are made between the pixels to block the photons generated within the avalanche area of one pixel against reaching the neighboring pixels. Oxide layer 11 with Si interface forms a reflective and isolation layer. The trenches may be filled with light absorptive material. Each pixel is loaded with a resistive layer 12 that quenches the avalanche when the pixel photocurrent exceeds a certain level. The quenching time is important parameter since it determines the pixel recovery time. The cathode metal contacts 20 from each pixel of SiPM are connected together and are hooked to the SiPM front-end electronics (not shown in FIG. 1). The back surface of SiPM is coated with metal 21 that serves as the anode contact.

Since the active volume of each pixel can be made very small (thin epi-layer d in FIG. 1), the thermally generated noise current can be minimized to the level when it does not interfere with detection of optical photons.

Among the drawbacks of the conventional front-illuminated structures like shown in FIG. 1, are the low quantum efficiency for the short wavelengths (<500 nm) and relatively small fill factor (FF). The latter parameter value is limited by the requirement to reserve a part of active area space for the avalanche quenching resistive layer, contacts, and metal traces.

Back-illuminated versions of SiPM may provide advantageous solutions since back-illuminated detectors have inherently higher quantum efficiency at the short wavelengths of light and FF is not limited by the resistive layer and metal traces, which are deposited opposite to the light incident surface of the device. The example of the back-illuminated SiPM integrated with Si drift detector is described in reference 16 (see FIG. 2). However, structures like shown in FIG. 2 have a significant drawback: These structures are designed on thick, bulk Si wafers and a significant amount of thermally generated carriers hinder detection of optical photons.

DETAILED DESCRIPTION OF THE PREFERRED EMBODIMENTS

The current invention proposes the back-illuminated SiPM structure that combines the advantages of the conventional structures described above, but at the same time is free of the conventional structure drawbacks.

Figure 3:
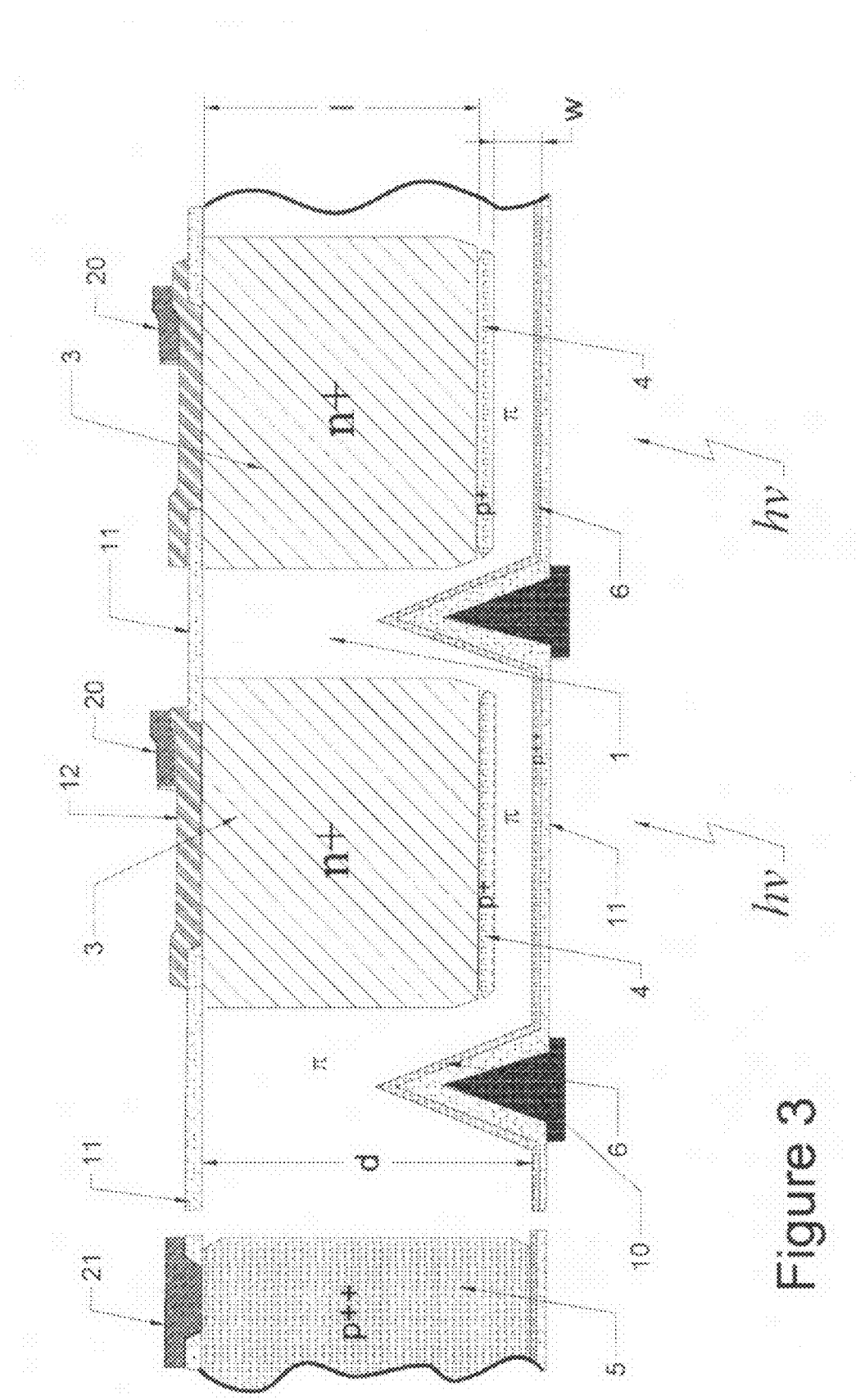
FIG. 3 is a schematic cross-section of the back-illuminated SiPM in accord with the current invention.

FIG. 3 shows schematically two pixels of the present invention design and describes the main features of the structure. SiPM is made using thin p-type Si substrate 1. The thin substrate may be made either with thinning in the middle of the process after the front side diffusion is done or starting with a thinned wafer—typically depending on the availability of suitable fabrication processes. The cathode diffusion 3 is made from the front side and is driven deep to make the junction close to the back surface of the die. In the other embodiment, the cathode can be made utilizing the buried n++ layer and via interconnections extending to the die front side (see FIG. 4). The buried layer 3 in FIG. 4 can be manufactured applying molecular beam epitaxy. Via connections 7 in FIG. 4 may be made using dry etch methods followed by via filling with a conductive material. The other traditional techniques for via interconnects may also be allied.

The avalanche p+ layer 4 is implanted from the backside, typically made using high energy ion implantation. For example, one can make a boron implantation ~2 microns deep into the surface from the backside using 1.1.MeV Boron beam. This layer may either touch the cathode n++ region 3 or may lay underneath it (isolated avalanche region structure). The width of the avalanche layer and the intrinsic layer width w are both small (several microns) to minimize the volume of thermally generated carriers' collection. A thin, uniform anode diffusion region 6 is formed on the die backside. This region may be electrically connected with the die front side via the through p++ diffusion region 5 at the edge of the die. Oxide layer 11 on the die backside serves as active area anti-reflection layer and isolation layer. Trenches 10 between the pixels of SiPM are made on the die backside. They should be deep enough to block the optical cross-talk generated inside the avalanche regions. The avalanche quenching resistive layer 12 is connected to each pixel and signals from each pixel are routed through the cathode metal contacts 20 to the front-end electronics. The common anode metal contact 21 may be made on the front surface to allow for the flip-chip die attach.

Alternatively, the common anode contact may be made on the edge of the die backside, which allows wire bonding of the anode to the substrate.

Figure 1:
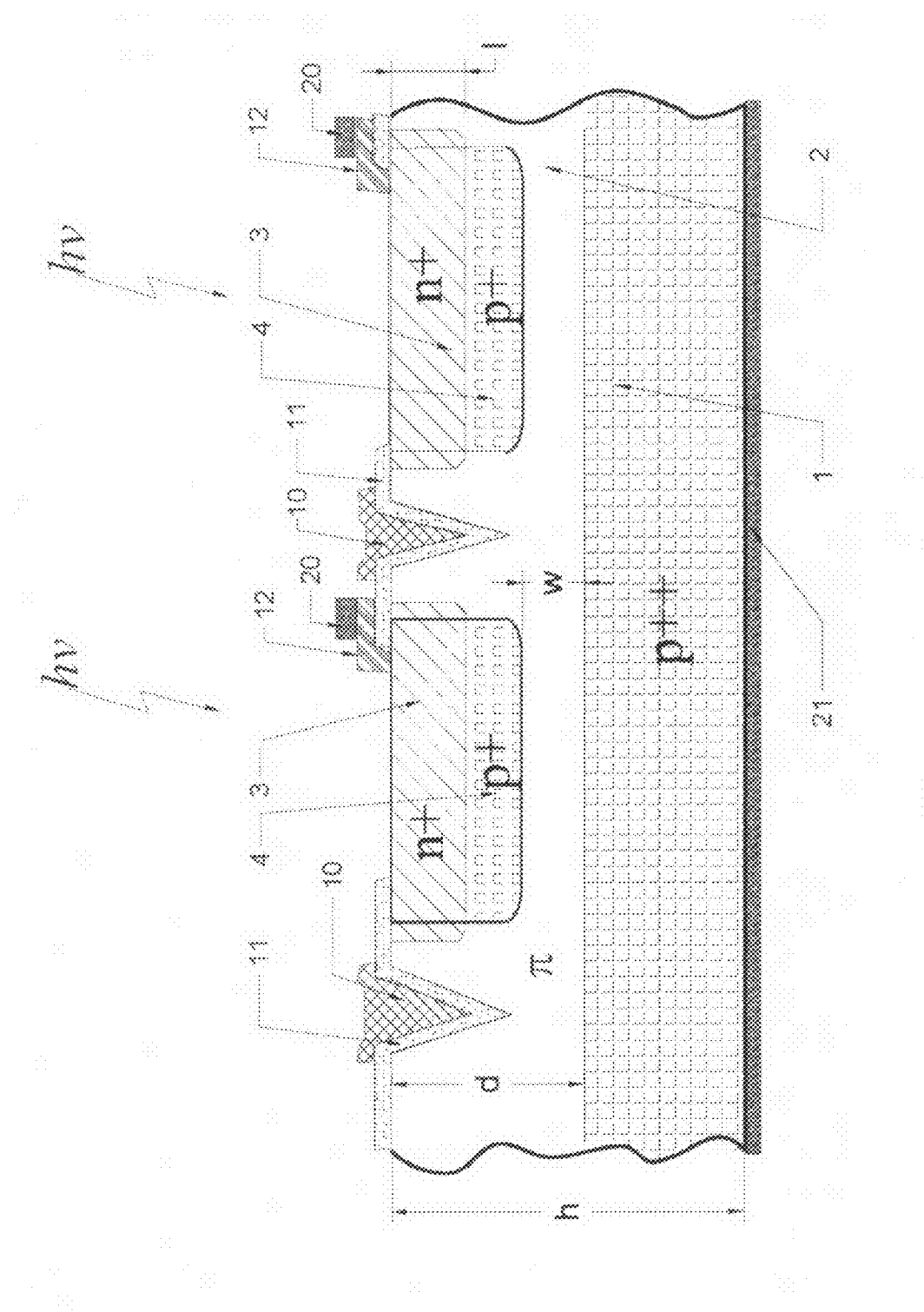
FIG. 1 is a schematic cross-section of the conventional front-illuminated SiPM.
Figure 2:
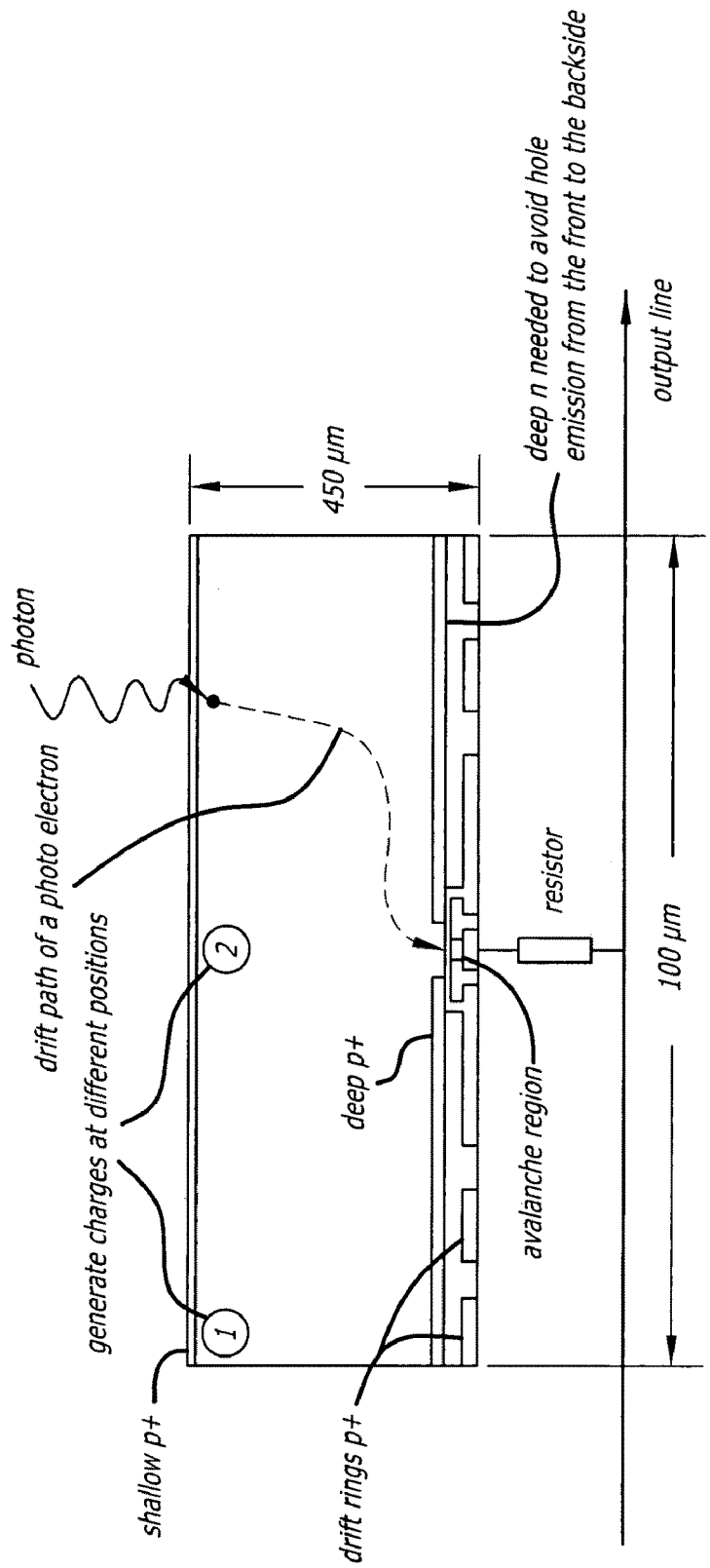
FIG. 2 is comprised of schematics of a typical back-illuminated Si drift detector integrated with SiPM.
Figure 4:
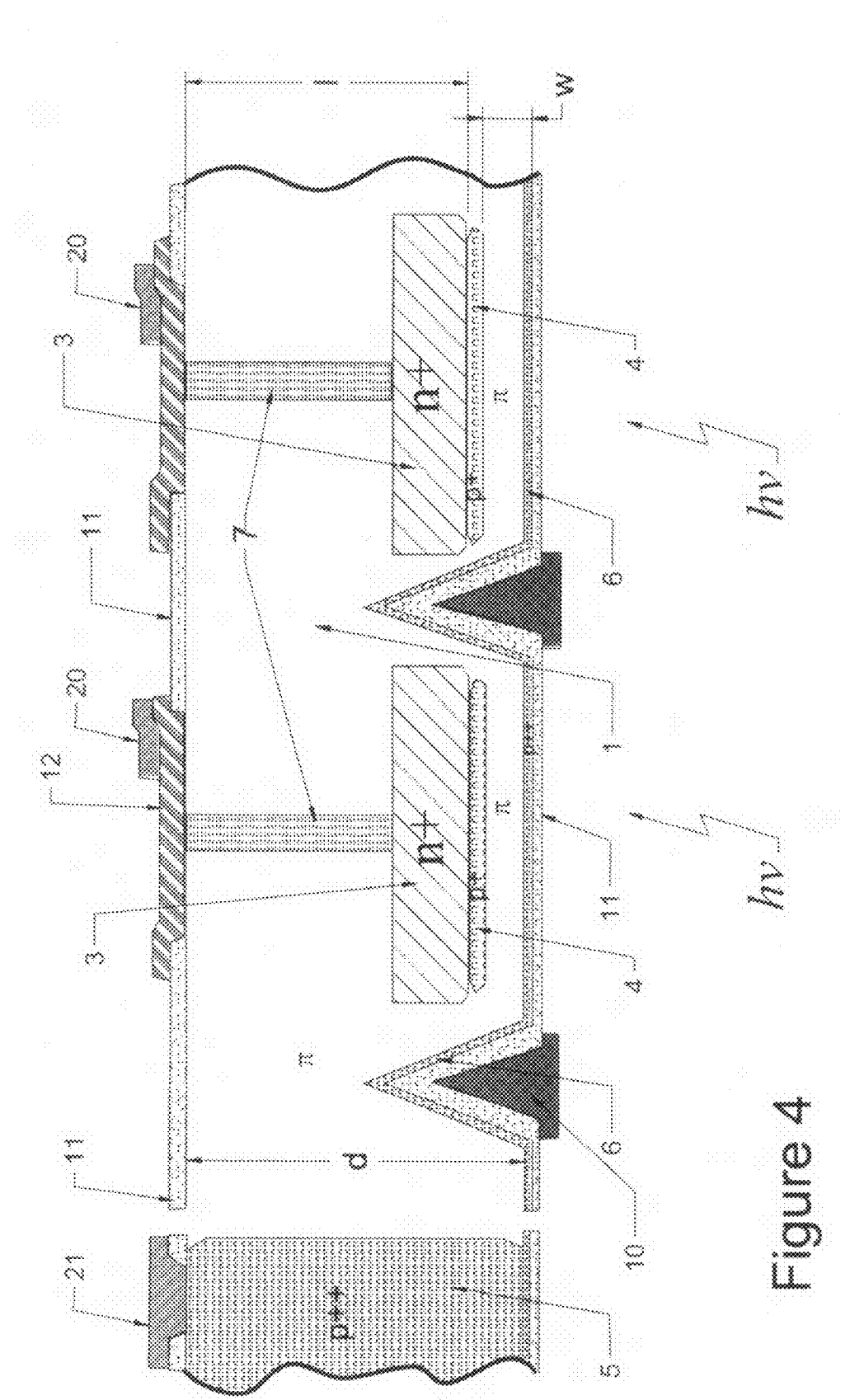
FIG. 4 is a schematic cross-section of the alternative version of the back-illuminated SiPM with the buried n++ layer and via interconnections extending from the buried layer to the die front side.

The structures in FIGS. 3 and 4 operate at a complete depletion condition. The depletion region penetrates the avalanche region 4 and extends through the "intrinsic" $\pi$ region to the die backside. This structure is characterized with a high quantum efficiency value within the wide wavelength range, including $\lambda$<500 nm. It also ensures fast response time and may provide larger fill-factor than front-illuminated structures of FIG. 1.

In fabrication of back-illuminated SiPM shown in FIGS. 3 and 4, selected steps of the baseline process used for fabrication of the backlit photodiode array described in reference 17, the disclosure of which is hereby incorporated herein by reference, can be used. These include but are not limited to the deep n++ (cathode) and through p++ (anode) diffusion regions.

The depth of the trenches is made sufficiently deep to block all optical photons from penetration the avalanche region from neighboring pixels' avalanche regions.

In the preferred embodiments, the substrate is a p substrate, which may be near intrinsic. However the conductivity types can be reversed for the devices in which the ionization rate for holes is higher than that for electrons.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A back-illuminated silicon photomultiplier comprising:
    a p-type substrate having front and back sides;
    a matrix of n+ regions in the p-type substrate;
    a matrix of p+ regions under the matrix of n+ regions and adjacent the back side of the substrate, with the bottoms of the matrix of n+ regions each forming a p/n junction with the substrate or the respective p+ region;
    a common anode formed by a uniform p++ deposition or implantation on the back side of the substrate; and,
    cathode contacts coupled to each of the n+ regions.

2. The photomultiplier of claim 1 wherein the n+ regions extend from the front side of the substrate.

3. The photomultiplier of claim 1 wherein the n+ regions comprise a buried layer, and wherein cathode contacts to the n+ regions are made by vias from the front side of the substrate to the n+ regions.

4. The photomultiplier of claim 1 further comprising a plurality of trenches in the back side of the substrate between the n+ regions, the trenches being filled with an opaque material.

5. The photomultiplier of claim 1 wherein the substrate is a thin substrate.

6. The photomultiplier of claim 1 wherein the substrate is less than approximately 150 um thick.

7. The photomultiplier of claim 1 wherein a contact of the common anode is provided on the back side of the substrate.

8. The photomultiplier of claim 1 further comprising a through p++ diffusion, wherein a contact of the common anode is brought out to the front side of the p-type substrate, the through diffusion being made from at least one side of the substrate.

9. The photomultiplier of claim 1 further comprising a through p++ diffusion, wherein a contact of the common anode is brought out to the front side of the substrate the through diffusion being made from both sides of the substrate.

10. The photomultiplier of claim 1 wherein the p+ regions under the matrix of n+ regions are in contact with the n+ regions.

11. The photomultiplier of claim 1 wherein the p+ regions under the matrix of n+ regions are not in contact with the n+ regions.

12. The photomultiplier of claim 1 wherein the cathode contacts are coupled to each of the n+ regions through a resistive layer.

13. A back-illuminated silicon photomultiplier comprising:
    a p-type substrate having front and back sides, and a thickness of less than approximately 150 um;
    a matrix of n+ regions in the p-type substrate;
    a matrix of p+ regions under the matrix of n+ regions and adjacent the back side of the substrate, with the bottom of the matrix of n+ regions forming a p/n junction with the substrate or the p+ region;
    a common anode formed by a uniform p++ deposition or implantation on the back side of the substrate;
    a plurality of trenches in the back side of the substrate between the n+ regions, the trenches being filled with an opaque material; and
    cathode contacts coupled to each of the n+ regions.

14. The photomultiplier of claim 13 wherein the n+ regions extend from the front side of the substrate.

15. The photomultiplier of claim 13 wherein the n+ regions comprise a buried layer, and wherein the cathode contacts to the n+ regions are made by vias from the front side of the substrate to the n+ regions.

16. The photomultiplier of claim 13 wherein a contact of the common anode is provided on the back side of the substrate.

17. The photomultiplier of claim 13 further comprising at least one through p++ diffusion, wherein a contact of the common anode is brought out to the front side of the p-type substrate, the through diffusion being made from one side of the substrate.

18. The photomultiplier of claim 13 further comprising at least one through p++ diffusion, wherein a contact of the common anode is brought out to the front side of the p-type substrate, the through diffusion being made from both sides of the substrate.

19. The photomultiplier of claim 13 wherein the p+ regions under the matrix of n+ regions are in contact with the matrix of n+ regions.

20. The photomultiplier of claim 13 wherein the p+ regions under the matrix of n+ regions are not in contact with the matrix of n+ regions.

21. The photomultiplier of claim 13 where the p+ regions are ion implanted regions.

22. The photomultiplier of claim 13 wherein the cathode contacts are coupled to each of the n+ regions through a resistive layer.

23. A back-illuminated silicon photomultiplier comprising:
- a substrate of a first conductivity type having front and back sides, and a thickness of less than approximately 150 um;
- a matrix of regions of a second conductivity type in the substrate;
- a matrix of regions of the first conductivity type under the matrix of regions of the second conductivity type and adjacent the back side of the substrate, with the bottom of the matrix of regions of the second conductivity type forming a p/n junction with the substrate or the matrix of regions of the first conductivity type, the matrix of regions of the first conductivity type having a higher conductivity than the substrate; a common anode formed by a uniform layer of the first conductivity type of higher conductivity than the substrate on the back side of the substrate; a plurality of trenches in the back side of the substrate between the second conductivity type regions, the trenches being filled with an opaque material; and cathode contacts coupled to each of the regions of the second conductivity type.

24. The photomultiplier of claim 23 wherein the matrix of regions of the second conductivity type extend from the front side of the substrate.

25. The photomultiplier of claim 23 wherein the matrix of regions of the second conductivity type comprise a buried layer, and wherein the cathode contacts to the matrix of regions of the second conductivity type are made by vias from the front side of the substrate to the matrix of regions of the second conductivity type.

26. The photomultiplier of claim 23 wherein a contact of the common anode is provided on the back side of the substrate.

27. The photomultiplier of claim 23 further comprising at least one through diffusion of the first conductivity type and of a higher conductivity than the substrate, wherein a contact of the common anode is brought out to the front side of the substrate, the through diffusion being made from one side of the substrate.

28. The photomultiplier of claim 23 further comprising at least one through diffusion of the first conductivity type, wherein a contact of the common anode is brought out to the front side of the substrate of a first conductivity type, the through diffusion being made from both sides of the substrate.

29. The photomultiplier of claim 23 wherein the matrix of regions of the first conductivity type under the matrix of regions of the second conductivity type are in contact with the matrix of regions of the second conductivity type.

30. The photomultiplier of claim 23 wherein the matrix of regions of the first conductivity type under the matrix of regions of the second conductivity type are not in contact with the matrix of regions of the second conductivity type.

31. The photomultiplier of claim 23 wherein the matrix of regions of the first conductivity type under the matrix of regions of the second conductivity type are ion implanted regions.

32. The photomultiplier of claim 23 wherein the cathode contacts are coupled to each of the regions of the second conductivity type through a resistive layer.

* * * * *